(12) United States Patent
Mori et al.

(10) Patent No.: US 12,346,143 B2
(45) Date of Patent: *Jul. 1, 2025

(54) VOLTAGE REGULATOR WITH POWER RAIL TRACKING

(71) Applicant: Taiwan Semiconductor Manufacturing Company, Ltd., Hsinchu (TW)

(72) Inventors: Haruki Mori, Hsinchu (TW); Hidehiro Fujiwara, Hsinchu (TW); Zhi-Hao Chang, Yunlin County (TW); Yangsyu Lin, New Taipei (TW); Yu-Hao Hsu, Tainan (TW); Yen-Huei Chen, Jhudong Township (TW); Hung-Jen Liao, Hsinchu (TW); Chiting Cheng, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/642,325

(22) Filed: Apr. 22, 2024

(65) Prior Publication Data

US 2024/0272666 A1    Aug. 15, 2024

Related U.S. Application Data

(63) Continuation of application No. 18/165,093, filed on Feb. 6, 2023, now Pat. No. 11,989,046, which is a (Continued)

(51) Int. Cl.
*G05F 1/10* (2006.01)
*G05F 3/24* (2006.01)
(Continued)

(52) U.S. Cl.
CPC ............ *G05F 3/24* (2013.01); *G05F 1/10* (2013.01); *G06F 1/28* (2013.01); *H01L 23/5286* (2013.01); *H10D 84/85* (2025.01)

(58) Field of Classification Search
CPC ... G05F 1/10; G05F 1/46; G05F 1/462; G05F 1/465; G05F 5/565; G05F 1/618;
(Continued)

(56) References Cited

U.S. PATENT DOCUMENTS 11,199,866 B2 * 12/2021 Mori ........................ G06F 1/28
11,579,648 B2 *  2/2023 Mori ........................ G05F 1/10
(Continued)

FOREIGN PATENT DOCUMENTS

JP    2010-130799 A    6/2010

OTHER PUBLICATIONS

Chinese Office Action on CN Appl. Ser. No. 202110126509.0 dated Apr. 24, 2022 (6 pages).

*Primary Examiner* — Long Nguyen
(74) *Attorney, Agent, or Firm* — FOLEY & LARDNER LLP

(57) ABSTRACT

Disclosed herein are related to an integrated circuit to regulate a supply voltage. In one aspect, the integrated circuit includes a metal rail including a first point, at which a first functional circuit is connected, and a second point, at which a second functional circuit is connected. In one aspect, the integrate circuit includes a voltage regulator coupled between the first point of the metal rail and the second point of the metal rail. In one aspect, the voltage regulator senses a voltage at the second point of the metal rail and adjusts a supply voltage at the first point of the metal rail, according to the sensed voltage at the second point of the metal rail.

20 Claims, 11 Drawing Sheets

Related U.S. Application Data continuation of application No. 17/535,206, filed on Nov. 24, 2021, now Pat. No. 11,579,648, which is a continuation of application No. 16/775,570, filed on Jan. 29, 2020, now Pat. No. 11,199,866.

(51) Int. Cl.
  *G06F 1/28* (2006.01)
  *H01L 23/528* (2006.01)
  *H10D 84/85* (2025.01)

(58) Field of Classification Search
  CPC ..... G05F 3/08; G05F 3/10; G05F 3/16; G05F 3/24; G06F 1/28; H01L 23/5286; H01L 27/092
  See application file for complete search history.

(56) References Cited

U.S. PATENT DOCUMENTS

| | | |
|---|---|---|
| 11,989,046 B2* | 5/2024 | Mori ............ G06F 1/28 |
| 2010/0219880 A1 | 9/2010 | Bae et al. |
| 2012/0140585 A1 | 6/2012 | Van Winkelhoff et al. |
| 2014/0266401 A1 | 9/2014 | Park et al. |
| 2016/0054746 A1* | 2/2016 | Thakur ............ G05F 1/46 |
| | | 327/540 |

* cited by examiner

1000

```
┌─────────────────────────────────────────────┐
│  Detect, by a transistor, a change in a first voltage  │
│              at a first metal rail              │
│                     1010                        │
└─────────────────────────────────────────────┘
                        │
                        ▼
┌─────────────────────────────────────────────┐
│      Adjust a drive strength of the transistor       │
│  according to a difference between the first voltage │
│       at the first metal rail and a second voltage   │
│              at a second metal rail             │
│                     1020                        │
└─────────────────────────────────────────────┘
                        │
                        ▼
┌─────────────────────────────────────────────┐
│       Adjust the first voltage at the first metal rail       │
│  according to the adjusted drive strength of the transistor  │
│                     1030                        │
└─────────────────────────────────────────────┘
```

FIG. 10

VOLTAGE REGULATOR WITH POWER RAIL TRACKING

CROSS-REFERENCE TO RELATED APPLICATION

This application is a continuation of the application that issued as U.S. Pat. No. 11,989,046, filed on Feb. 6, 2023, which is a continuation of the application that issued as U.S. Pat. No. 11,579,648, filed on Nov. 24, 2021, which is a continuation of the application that issued as U.S. Pat. No. 11,199,866, filed on Jan. 29, 2020, each of which is incorporated herein by reference in its entirety.

BACKGROUND

Developments in an integrated circuit design allow an integrated circuit to perform complex functionalities. In one aspect, multiple circuits can be integrated into a single integrated circuit, where each circuit may be designed to perform or execute a corresponding functionality. In some cases, different circuits can operate according to different power domains. For example, a digital circuit may operate according to a lower supply voltage (e.g., 1.0 V), where an analog circuit or a radio frequency (RF) circuit may operate according to a higher supply voltage (e.g., 1.5V). Different power domains may help different circuits to operate in an efficient manner, for example, in terms of power and speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of a method of regulating a first supply voltage at a first metal rail according to a second supply voltage at a second metal rail, in accordance with some embodiments.

DETAILED DESCRIPTION

Figure 1:
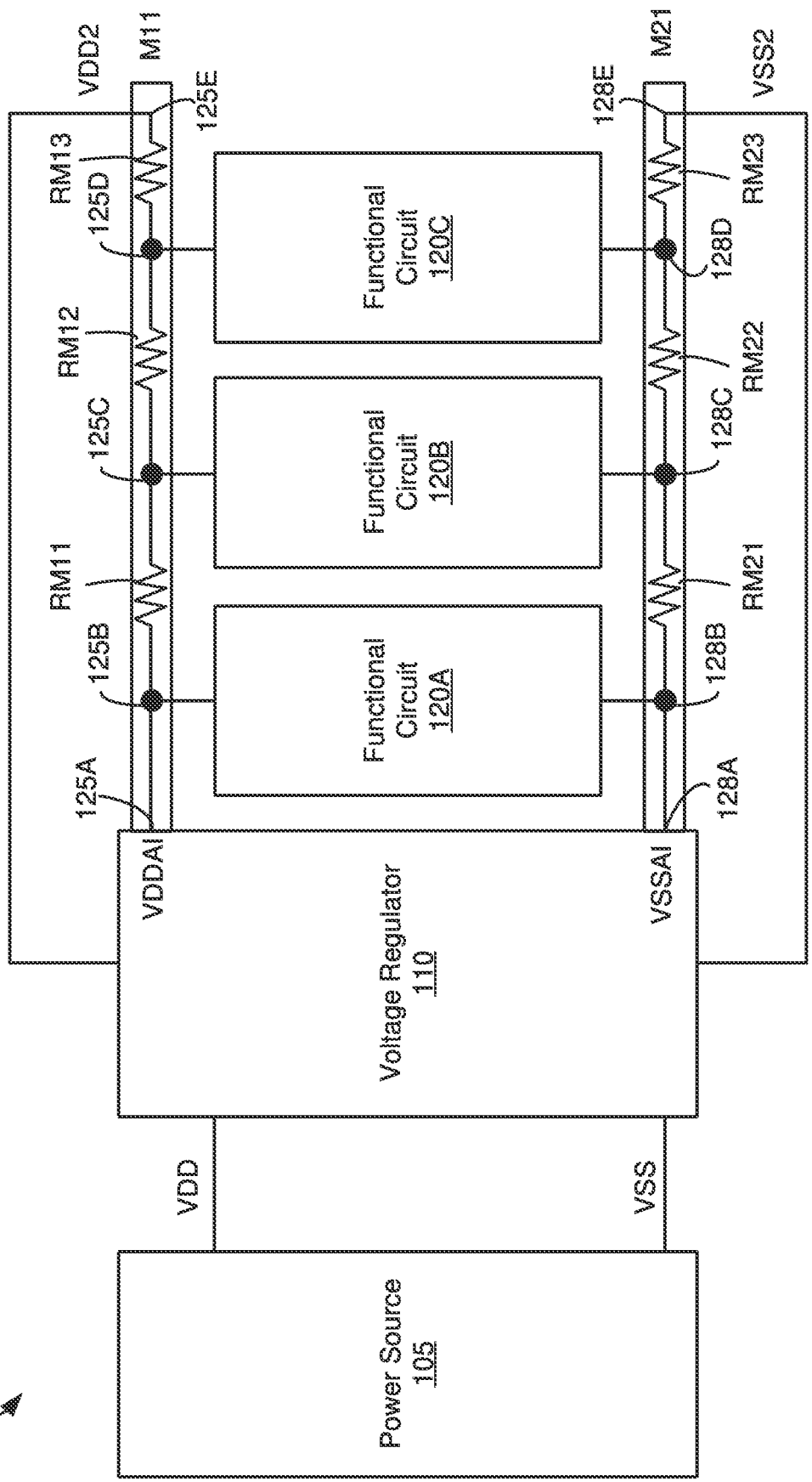
FIG. 1 is a diagram of a system including a voltage regulator for regulating a supply voltage, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to an integrated circuit to regulate a supply voltage. In some embodiments, the integrated circuit includes or is coupled to a metal rail including a first point, at which a first functional circuit is connected and a second point, at which a second functional circuit is connected. Each of the one or more functional circuits may include an active circuit that consumes power through the metal rail to perform a corresponding functionality. In one aspect, the integrate circuit includes a voltage regulator coupled between the first point of the metal rail and the second point of the metal rail. In one aspect, the voltage regulator senses a voltage at the second point and adjusts the supply voltage at the first point of the metal rail, according to the sensed voltage at the second point of the metal rail.

In some embodiments, the integrated circuit includes a transistor including a drain electrode coupled to the first point of the metal rail, and a gate electrode coupled to the second point of the metal rail. In this configuration, the transistor may sense the voltage at the second point and adjust the supply voltage at the first point of the metal rail, according to the sensed voltage at the second point of the metal rail. In one aspect, the metal rail has a parasitic resistance that may cause a voltage at the first point of the metal rail and a voltage at the second point of the metal rail to differ. According to the integrated circuit including the transistor having the gate electrode coupled to the second point of the metal rail, the supply voltage at the second point of the metal rail can be regulated.

FIG. 1 is a diagram of a system 100 including a voltage regulator 110 for regulating a supply voltage, in accordance with one embodiment. In some embodiments, the system 100 is embodied as an electronic system, device, or an integrated circuit. In some embodiments, the system 100 includes a power source 105, the voltage regulator 110, and functional circuits 120A, 120B, 120C. In one aspect, the system 100 performs multiple functionalities according to multiple power domains. In some embodiments, the system 100 includes more, fewer, or different components than shown in FIG. 1. For example, the system 100 includes a different number of functional circuits 120 than shown in FIG. 1.

The power source 105 is a component that provides supply voltages VDD, VSS to the voltage regulator 110. In some example, the supply voltage VDD is 1.5V and the supply voltage VSS is 0V. In some cases, the power source 105 is implemented as battery (e.g., 1.5V). In some cases, the power source 105 is implemented as a circuitry that receives external power and generates the supply voltages VDD, VSS according to the external power. For example, the power source 105 receives an AC input voltage and converts the AC input voltage into DC voltages VDD, VSS. For another example, the power source 105 receives a DC input voltage and converts the DC input voltage into different DC voltages VDD, VSS.

The voltage regulator 110 is a component that receives the supply voltages VDD, VSS and generates different supply voltages VDDAI, VSSAI for different power domains. For example, the voltage regulator 110 may provide the supply voltage VDDAI through the metal rail M11 and provide the supply voltage VSSAI through the metal rail M21. In one configuration, the voltage regulator 110 is coupled to metal rails M11 and M21. The voltage regulator 110 may be electrically coupled between a point 125A of the metal rail M11, and a point 125E of the metal rail M11. For example, a first output of the voltage regulator 110 is coupled to the point 125A of the metal rail M11, and a first input of the voltage regulator 110 is coupled to the point 125E of the metal rail M11. In addition, the voltage regulator 110 may be electrically coupled between a point 128A of the metal rail M21, and a point 128E of the metal rail M21. For example, a second output of the voltage regulator 110 is coupled to the point 128A of the metal rail M21, and a second input of the voltage regulator 110 is coupled to the point 128E of the metal rail M21.

In one implementation, the functional circuits 120A, 120B, 120C are powered according to supply voltages provided through the metal rails M11, M21. The functional circuits 120A, 120B, 120C may include active circuits (e.g., transistors) that are configured to perform or execute different functionalities. In one example, the functional circuit 120A is coupled between a point 125B of the metal rail M11 and a point 128B of the metal rail M21. In one example, the functional circuit 120B is coupled between a point 125C of the metal rail M11 and a point 128C of the metal rail M21. In one example, the functional circuit 120C is coupled between a point 125D of the metal rail M11 and a point 128D of the metal rail M21. In one aspect, the functional circuit 120A is closer to the points 125A, 128A than the other functional circuits 120B, 120C, where the functional circuit 120C is farther away from the points 125A, 128A than the other functional circuits 120A, 120B.

In some embodiments, the voltage regulator 110 adaptively adjusts supply voltages VDDAI, VSSAI provided through the metal rails M11, M21 to allow the functional circuits 120A-120C to operate appropriately. In one aspect, the functional circuits 120A, 120B, 120C may be designed to operate according to the same supply voltages VDDAI, VSSAI. However, a segment of the metal rail M11 between the point 125B and the point 125E may have parasitic resistances RM11, RM12, RM13 (e.g., 30~300Ω) due to physical characteristic of the metal rail M11. Similarly, a segment of the metal rail M21 between the points 128B and the point 128E may have parasitic resistances RM21, RM22, RM23 (e.g., 30~300Ω) due to physical characteristic of the metal rail M21. Such parasitic resistances RM11, RM12, RM13, RM21, RM22, RM23 may degrade performance of the functional circuits 120A, 120B, 120C. For example, a voltage at the point 125C may be lower than a voltage at the point 125B due to the parasitic resistance RM11, and a voltage at the point 125D may be lower than the voltage at the point 125C due to the parasitic resistance RM12. Moreover, when the functional circuits 120A, 120B, 120C are active or enabled, voltages at the points 125B, 125C may change or vary because the functional circuits 120A, 120B, 120C may draw current or consume power. In one aspect, the voltage regulator 110 may sense the voltage VDD2 at the point 125E of the metal rail M11 and adjust or regulate the voltage VDDAI provided at the point 125A of the metal rail M11 according to the sensed voltage VDD2. For example, if the supply voltage VDD2 at the point 125E of the metal rail M11 decreases, the voltage regulator 110 may increase the voltage VDDAI at the point 125A of the metal rail M11. Similarly, the voltage regulator 110 may sense the voltage VSS2 at the point 128E of the metal rail M21, and adjust or regulate the voltage VSSAI provided at the point 128A of the metal rail M21 according to the sensed voltage VSS2. For example, if the supply voltage VSS2 at the point 128E of the metal rail M21 increases, the voltage regulator 110 may decrease the voltage VSSAI at the point 128A of the metal rail M21. By adaptively adjusting the supply voltages VDDAI, VSSAI according to the sensed voltages VDD2, VSS2, the functional circuits 120A-120C can operate as designed. Detailed descriptions on implementations and operations of the voltage regulator 110 are provided below with respect to FIGS. 2 through 10.

Figure 2:
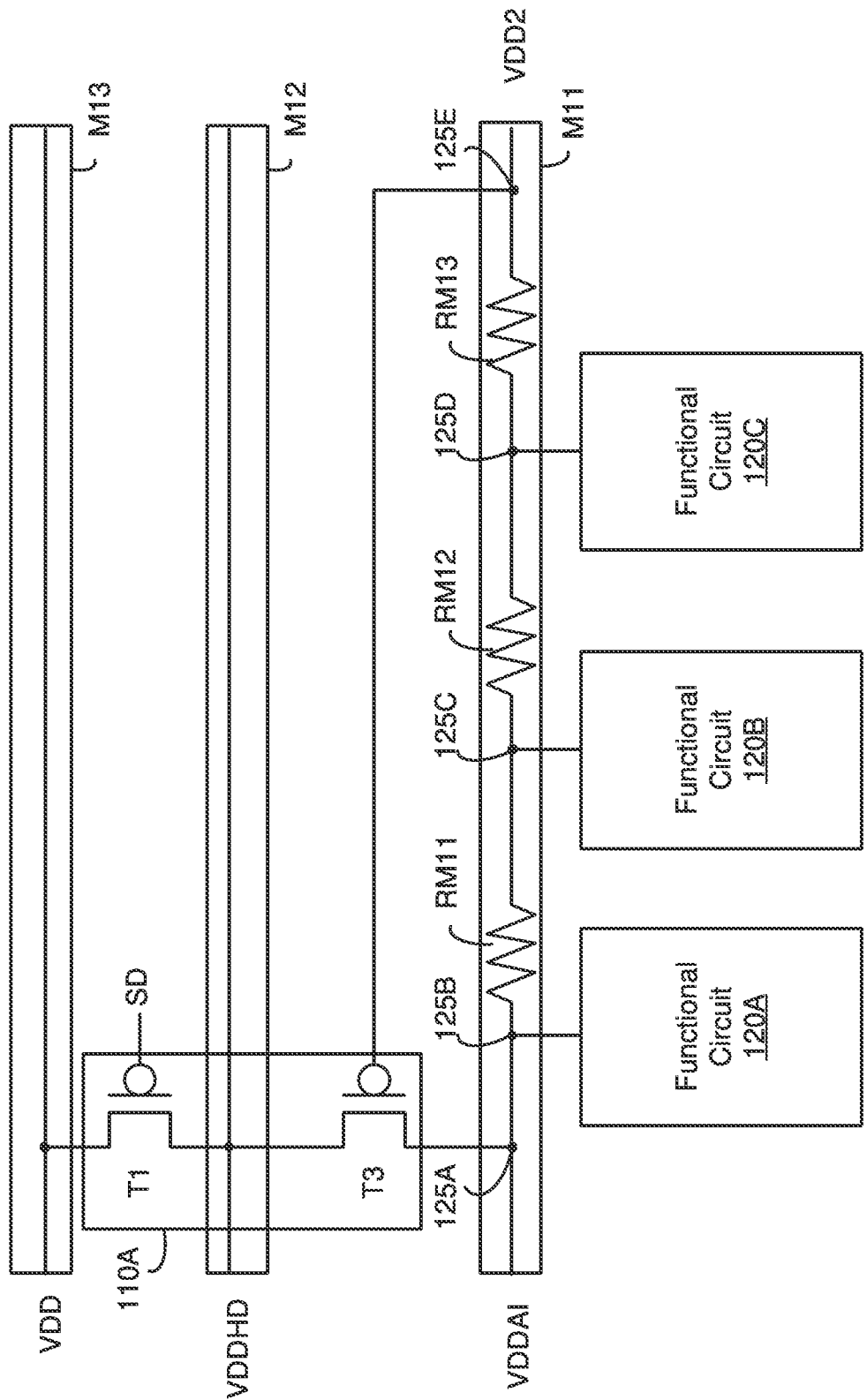
FIG. 2 is a diagram of a voltage regulator, in accordance with one embodiment.

FIG. 2 is a diagram of a portion of the system 100 including a voltage regulator 110A, in accordance with one embodiment. In some embodiments, the voltage regulator 110A is coupled to metal rails M11, M12, M13. Each of the metal rails M11, M12, M13 may include conductive metal. Each of the metal rails M11, M12, M13 may be on a single layer, or may be on different layers connected through via contacts. In one example, the metal rail M11 provides a supply voltage VDDAI, the metal rail M12 provides a supply voltage VDDHD, and the metal rail M13 provides a supply voltage VDD. The supply voltage VDD may be higher than or substantially equal to the supply voltage VDDHD (e.g., 1.5V), and the supply voltage VDDHD may be higher than the supply voltage VDDAI (e.g., 1.0V). Different supply voltages VDD, VDDHD, VDDAI can be provided to different functional circuits to execute different operations.

In some embodiments, the voltage regulator 110A includes transistors T1, T3 to generate or regulate supply voltages VDDHD, VDDAI. The transistors T1, T3 may be implemented as a P-type transistor (e.g., P-type MOSFET, P-type BTJ, P-type FinFET, etc.). In one example, the transistor T1 is coupled between the metal rails M13 and M12, and the transistor T3 is coupled between the metal rails M12 and M11. The transistors T1, T3 may be implemented as a P-type transistor (e.g., P-type MOSFET, P-type BTJ, P-type FinFET, etc.).

In one aspect, the transistor T1 operates as a switch that enables or disables current through the transistor T1 between the metal rails M12, M13. In other embodiments, the voltage regulator 110A includes a different component or a different circuit that performs the functionality of the transistor T1. In one configuration, the transistor T1 includes a source electrode coupled to the metal rail M13, a drain electrode coupled to the metal rail M12, and a gate electrode coupled to an external control device. In this configuration, the transistor T1 may enable or disable current through the transistor T1 between the metal rails M12, M13, according to a control signal SD. For example, the control signal SD having a low voltage (e.g., 0V) can enable the transistor T1 such that current may flow through the transistor T1 between the metal rails M12, M13. Similarly, the control signal SD having a high voltage (e.g., 1.5V) can disable the transistor T1 such that current may not flow through the transistor T1 between the metal rails M12, M13.

In one aspect, the transistor T3 senses a voltage VDD2 at the point 125E of the metal rail M11 and adjusts the voltage VDDAI at the point 125A of the metal rail M11 according to the sensed voltage VDD2. In other embodiments, the voltage regulator 110A includes a different component or a different circuit that performs the functionality of the transistor T3. In one configuration, the transistor T3 includes a source electrode coupled to the metal rail M12, a drain electrode coupled to the point 125A of the metal rail M11, and a gate electrode coupled to the point 125E of the metal rail M11. The drain electrode of the transistor T3 may be directly coupled to the point 125A of the metal rail M11 though a conductive trace or conductive line. Similarly, the gate electrode of the transistor T3 may be directly coupled to the point 125E of the metal rail M11 though a conductive trace or conductive line. In this configuration, the transistor T3 can sense the voltage VDD2, and adaptively adjust the voltage VDDAI according to the sensed voltage VDD2. For example, if the supply voltage VDD2 at the point 125E of the metal rail M11 decreases, the transistor T3 may increase the voltage VDDAI at the point 125A of the metal rail M11 by increasing a current supplied to the point 125A. For example, if the supply voltage VDD2 at the point 125E of the metal rail M11 increases, the transistor T3 may decrease the voltage VDDAI at the point 125A of the metal rail M11 by decreasing a current supplied to the point 125A. Accordingly, the transistor T3 may regulate or control voltages at the points 125A, 125B, 125C, 125D, 125E of the metal rail M11 through a negative feedback loop. Hence, the voltage regulator 110A may reduce variations or changes in the voltages at the points 125A, 125B, 125C, 125D, 125E of the metal rail M11 to ensure stable operations of the functional circuits 120A, 120B, 120C.

Figure 3:
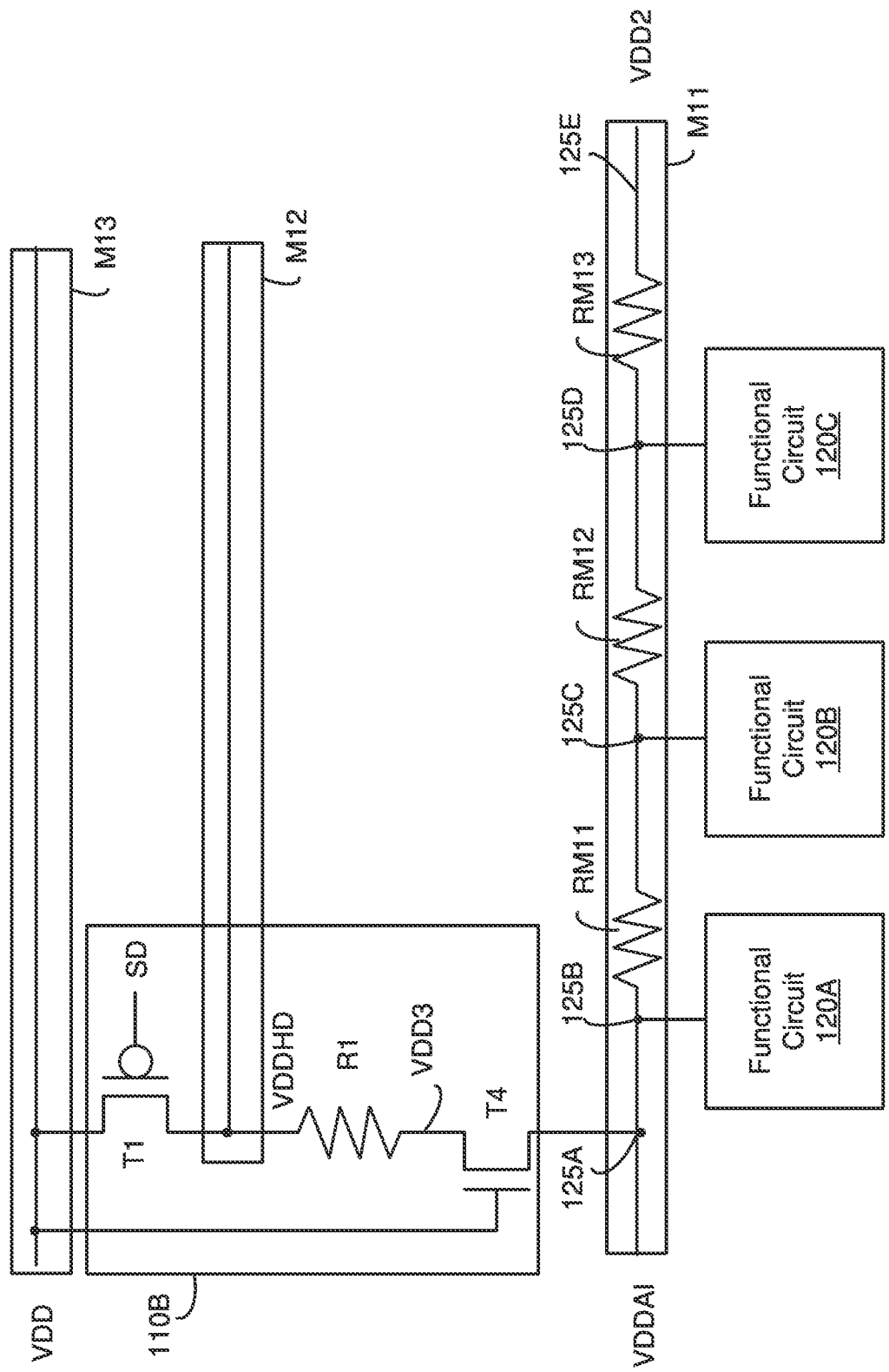
FIG. 3 is a diagram of a voltage regulator, in accordance with one embodiment.

FIG. 3 is a diagram of a portion of the system 100 including a voltage regulator 110B, in accordance with one embodiment. The configuration of the voltage regulator 110B is substantially similar to the circuit 110A of FIG. 2, except the transistor T4 is implemented to replace the transistor T3 of FIG. 2. In some embodiments, the transistor T4 is a N-type transistor (e.g., N-type MOSFET, N-type BJT, N-type FinFET, etc.). The transistor T4 includes a drain electrode coupled to the metal rail M12, a source electrode coupled to the point 125A of the metal rail M11, and a gate electrode coupled to the metal rail M13. The source electrode of the transistor T4 may be directly coupled to the point 125A of the metal rail M11 though a conductive trace or conductive line. Similarly, the gate electrode of the transistor T4 may be directly coupled to the metal rail M13 (or a source electrode of the transistor T1) though a conductive trace or conductive line. In other embodiments, the voltage regulator 110B includes a different component or a different circuit that performs the functionality of the transistor T4.

In one aspect, a connection between the metal rail M12 and the transistor T4 may have a parasitic resistance R1 (e.g., 30~300Ω). Such parasitic resistance R1 may cause a voltage VDD3 at the drain electrode of the transistor T4 to change or vary, which may also affect the supply voltages VDDAI, VDD2 at the metal rail M11. When the functional circuits 120A, 120B, 120C become active, the supply voltage VDDAI may drop or decrease due to the increased current demand from the functional circuits 120A, 120B, 120C. The transistor T4 can sense a change in a voltage difference between the gate electrode and the source electrode, and adjust or change a drive strength (e.g., transconductance) according to the sensed change in the voltage difference. For example, in response to the decreasing voltage VDDAI, the transistor T4 may increase the drive strength and increase current supplied through the transistor T4 such that the voltage VDDAI may increase. For example, in response to the increasing voltage VDDAI, the transistor T4 may decrease the drive strength and reduce current supplied through the transistor T4 such that the voltage VDDAI may decrease. Accordingly, the bypass connection at the gate electrode of the transistor T4 allows the transistor T4 to regulate or control a voltage VDD3 at the drain electrode and/or the voltage VDDAI at the point 125A of the metal rail M11. Hence, the voltage regulator 110B may reduce variations or changes in the voltages at the points 125A, 125B, 125C, 125D, 125E of the metal rail M11 to ensure stable operations of the functional circuits 120A, 120B, 120C, according to the voltage VDD at the metal rail M13.

Figure 4:
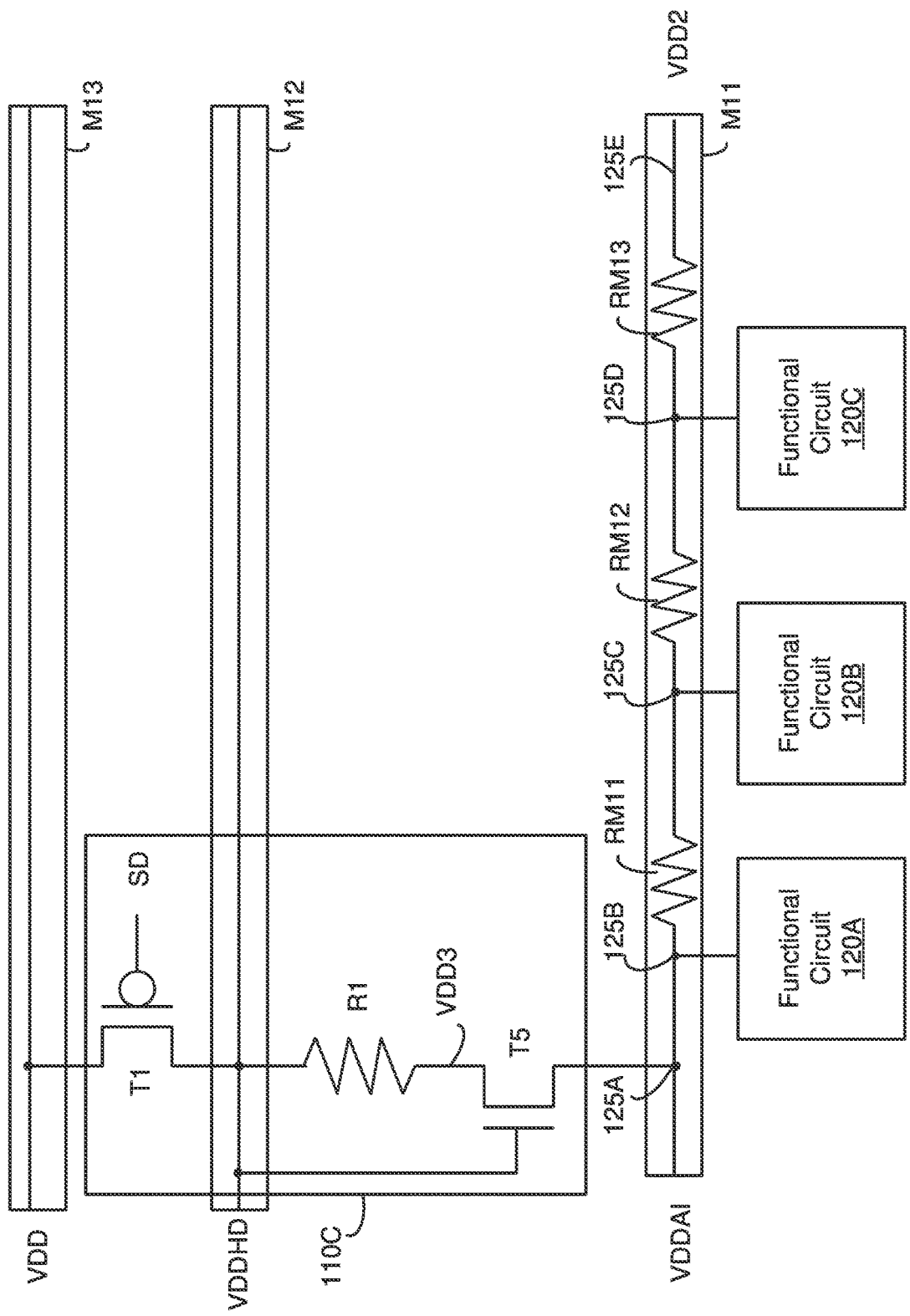
FIG. 4 is a diagram of a voltage regulator, in accordance with one embodiment.

FIG. 4 is a diagram of a portion of the system 100 including a voltage regulator 110C, in accordance with one embodiment. The configuration of the voltage regulator 110C is substantially similar to the voltage regulator 110B of FIG. 3, except the transistor T5 is implemented to replace the transistor T4 of FIG. 3. In some embodiments, the transistor T5 is a N-type transistor (e.g., N-type MOSFET, N-type BJT, N-type FinFET, etc.). The transistor T5 includes a drain electrode coupled to the metal rail M12, a source electrode coupled to the point 125A of the metal rail M11, and a gate electrode coupled to the metal rail M12. The source electrode of the transistor T5 may be directly coupled to the point 125A of the metal rail M11 though a conductive trace or conductive line. Similarly, the gate electrode of the transistor T5 may be directly coupled to the metal rail M12 (or a drain electrode of the transistor T1) though a conductive trace or conductive line. In this configuration, the transistor T5 can sense a change in a voltage difference between the gate electrode and the source electrode, and adjust or change a drive strength (e.g., transconductance) according to the sensed change in the voltage difference. Hence, the voltage regulator 110C may reduce variations or changes in the voltages at the points 125A, 125B, 125C, 125D, 125E of the metal rail M11 to ensure stable operations of the functional circuits 120A, 120B, 120C, according to the voltage VDDHD at the metal rail M12 instead of the voltage VDD at the metal rail M13. In other embodiments, the voltage regulator 110C includes a different component or a different circuit that performs the functionality of the transistor T5.

Figure 5:
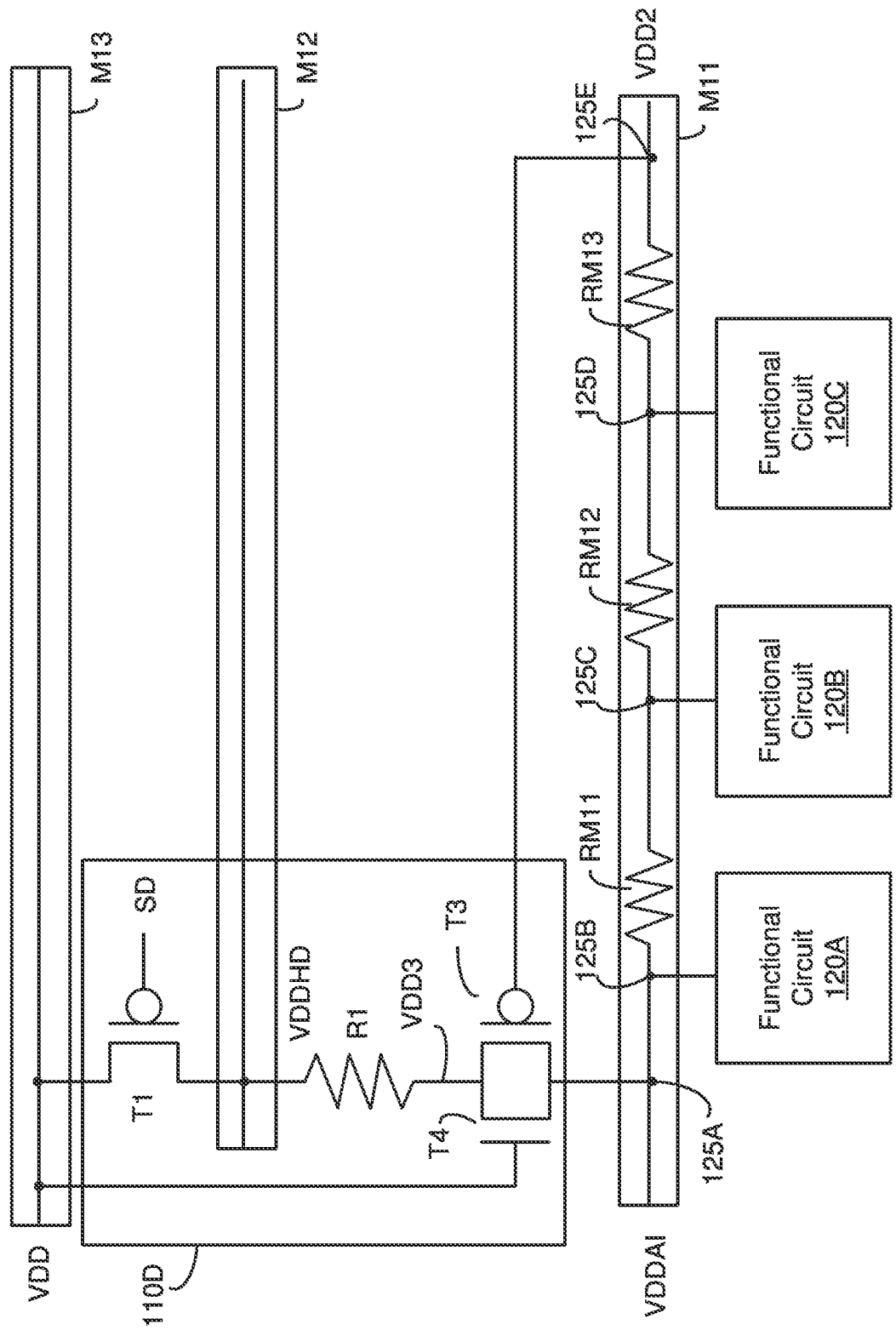
FIG. 5 is a diagram of a voltage regulator, in accordance with one embodiment.

FIG. 5 is a diagram of a portion of the system 100 including a voltage regulator 110D, in accordance with one embodiment. In one aspect, the voltage regulator 110D is a combination of the voltage regulator 110A of FIG. 2 and the voltage regulator 110B of FIG. 3. In one configuration, the voltage regulator 110D includes the transistor T3 and the transistor T4 that are coupled to each other in parallel between the metal rails M11, M12. In one aspect, the drain electrode of the transistor T3 is directly connected to the source electrode of the transistor T4, and the source electrode of the transistor T3 is directly connected to the drain electrode of the transistor T4. As described above with respect to FIG. 2, the transistor T3 can adjust or regulate the voltages at the points 125A-125E of the metal rail M11, according to the voltage VDD2 at the point 125E of the metal rail M11. Similarly, as described above with respect to FIG. 3, the transistor T4 can adjust or regulate the voltages at the points 125A-125E of the metal rail M11 according to the voltage VDD of the metal rail M13. Hence, the voltage regulator 110D may reduce variations or changes in the voltages at the points 125A-125E of the metal rail M11 to ensure stable operations of the functional circuits 120A, 120B, 120C.

Figure 6:
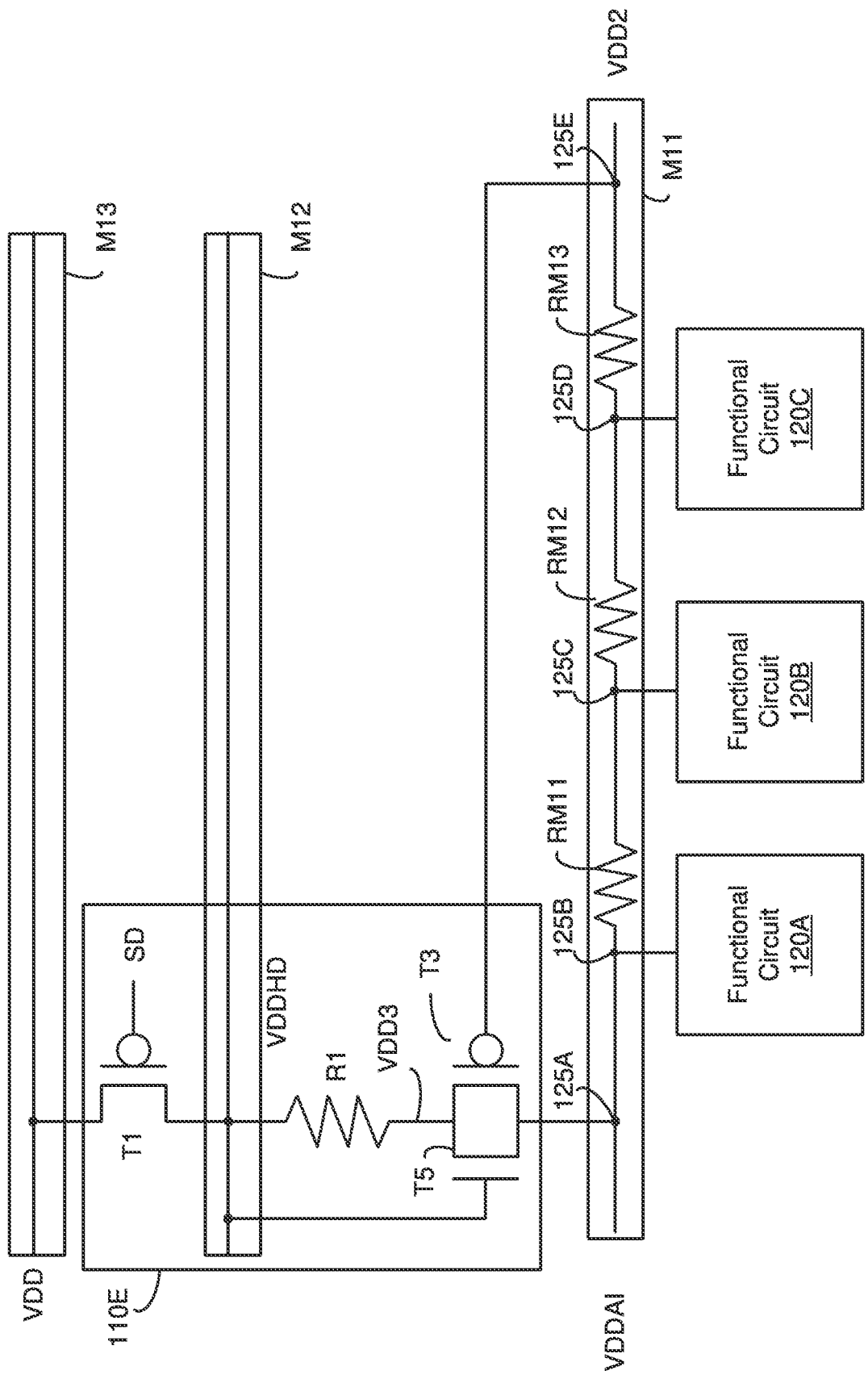
FIG. 6 is a diagram of a voltage regulator, in accordance with one embodiment.

FIG. 6 is a diagram of a portion of the system 100 including a voltage regulator 110E, in accordance with one embodiment. In one aspect, the voltage regulator 110E is a combination of the voltage regulator 110A of FIG. 2 and the voltage regulator 110C of FIG. 4. In one configuration, the voltage regulator 110E includes the transistor T3 and the transistor T5 that are coupled to each other in parallel between the metal rails M11, M12. In one aspect, the drain electrode of the transistor T3 is directly connected to the source electrode of the transistor T5, and the source electrode of the transistor T3 is directly connected to the drain electrode of the transistor T5. As described above with respect to FIG. 2, the transistor T3 can adjust or regulate the voltages at the points 125A-125E of the metal rail M11, according to the voltage VDD2 at the point 125E of the metal rail M11. Similarly, as described above with respect to FIG. 4, the transistor T5 can adjust or regulate the voltages at the points 125A-125E of the metal rail M11, according to the voltage VDDHD of the metal rail M12. Hence, the voltage regulator 110E may reduce variations or changes in the voltages at the points 125A-125E of the metal rail M11 to ensure stable operations of the functional circuits 120A, 120B, 120C.

Although voltage regulators for regulating supply voltages VDD, VDDHD, VDDAI, VDD2 are described above with respect to FIGS. 2 through 6, the principles disclosed herein can be applied to regulate different voltages (e.g., VSS, VSSHD, VSSAI, VSS2). For example, some P-type transistors in the voltage regulators 110A-110E in FIGS. 2-6 can be replaced by N-type transistors, and some N-type transistors in the voltage regulators 110A-110E in FIGS. 2-6 can be replaced by P-type transistors.

Figure 7:
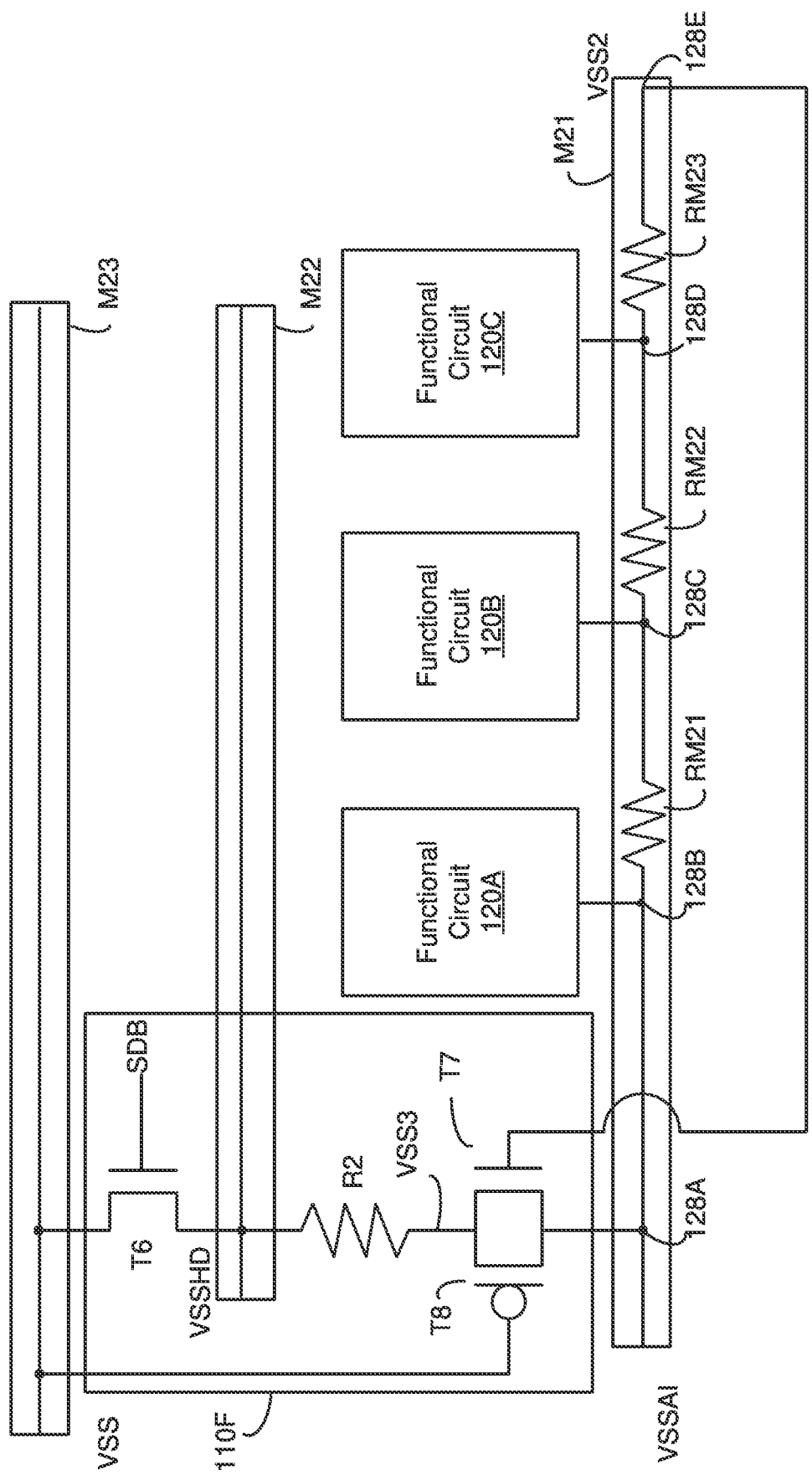
FIG. 7 is a diagram of a voltage regulator, in accordance with one embodiment.

FIG. 7 is a diagram of a portion of the system 100 including a voltage regulator 110F, in accordance with one embodiment. The voltage regulator 110F may be a counter part of the voltage regulator 110D of FIG. 5, such that the voltage regulator 110F can generate, provide, or regulate the supply voltages (e.g., VSS, VSSHD, VSSAI, VSS2). In some embodiments, the system 100 includes metal rails M21, M22, M23. Each of the metal rails M21, M22, M23 may include conductive metal. Each of the metal rails M21, M22, M23 may be on a single layer, or may be on different layers connected through via contacts. In one example, the metal rail M21 provides a supply voltage VSSAI or VSS2, the metal rail M22 provides a supply voltage VSSHD, and the metal rail M23 provides a supply voltage VSS. The supply voltage VSS (e.g., 0V) may be lower than or equal to the supply voltage VSSHD, and the supply voltage VSSHD may be lower than the supply voltage VSS2 (e.g., 0.4V). Different supply voltages VSS, VSSHD, VSS2 can be provided to different functional circuits to execute different operations.

In one implementation, the voltage regulator 110F includes transistors T6, T7, T8 to generate or regulate supply voltages VSSHD, VSSAI. In one example, the transistor T6 is coupled between the metal rails M23 and M22, and the transistors T7 and T8 are coupled between the metal rails M22 and M21. The transistors T6, T7 may be implemented as a N-type transistor, and the transistor T8 may be implemented as a P-type transistor. In one configuration, the transistor T6 includes a source electrode coupled to the metal rail M23, a drain electrode coupled to the metal rail M22, and a gate electrode coupled to an external control device. In this configuration, the transistor T6 may operate as a switch that enables or disables current through the transistor T6 between the metal rails M22, M23, according to a control signal SDB. The control signal SDB may be inverse of the control signal SD. For example, the control signal SDB having a high voltage (e.g., 1.5V) can enable the transistor T6 such that current may flow through the transistor T6 between the metal rails M22, M23. Similarly, the control signal SDB having a low voltage (e.g., 0V) can disable the transistor T6 such that current may not flow through the transistor T6 between the metal rails M22, M23.

In one configuration, the transistor T7 includes a source electrode coupled to the metal rail M22, a drain electrode coupled to a point 128A of the metal rail M21, and a gate electrode coupled to a point 128E of the metal rail M21. In one configuration, the transistor T8 includes a drain electrode coupled to the metal rail M22, a source electrode coupled to a point 128A of the metal rail M21, and a gate electrode coupled to the metal rail M23. The source electrode of the transistor T8 may be directly coupled to the point 128A of the metal rail M21 and the drain electrode of the transistor T7 though a conductive trace or conductive line. The drain electrode of the transistor T8 may be directly coupled to the source electrode of the transistor T7 though a conductive trace or conductive line. Moreover, the gate electrode of the transistor T8 may be directly coupled to the metal rail M23 (or a source electrode of the transistor T6) though a conductive trace or conductive line. In this configuration, the supply voltages VSS3, VSSAI, VSS2 can be regulated, despite of parasitic resistances RM21, RM22, RM23, R2. As described above with respect to FIG. 5, the transistor T7 can adjust or regulate the voltages at the points 128A-128E of the metal rail M21 according to the voltage VSS2 of the metal rail M21. Similarly, as described above with respect to FIG. 5, the transistor T8 can adjust or regulate the voltages at the points 128A-128E of the metal rail M21 according to the voltage VSS of the metal rail M23. Hence, the voltage regulator 110F may reduce variations or changes in the voltages at the points 128A-128E of the metal rail M21 to ensure stable operations of the functional circuits 120A, 120B, 120C. In other embodiments, the voltage regulator 110F includes a different component or a different circuit that performs the functionality of the transistors T7, T8.

Figure 8:
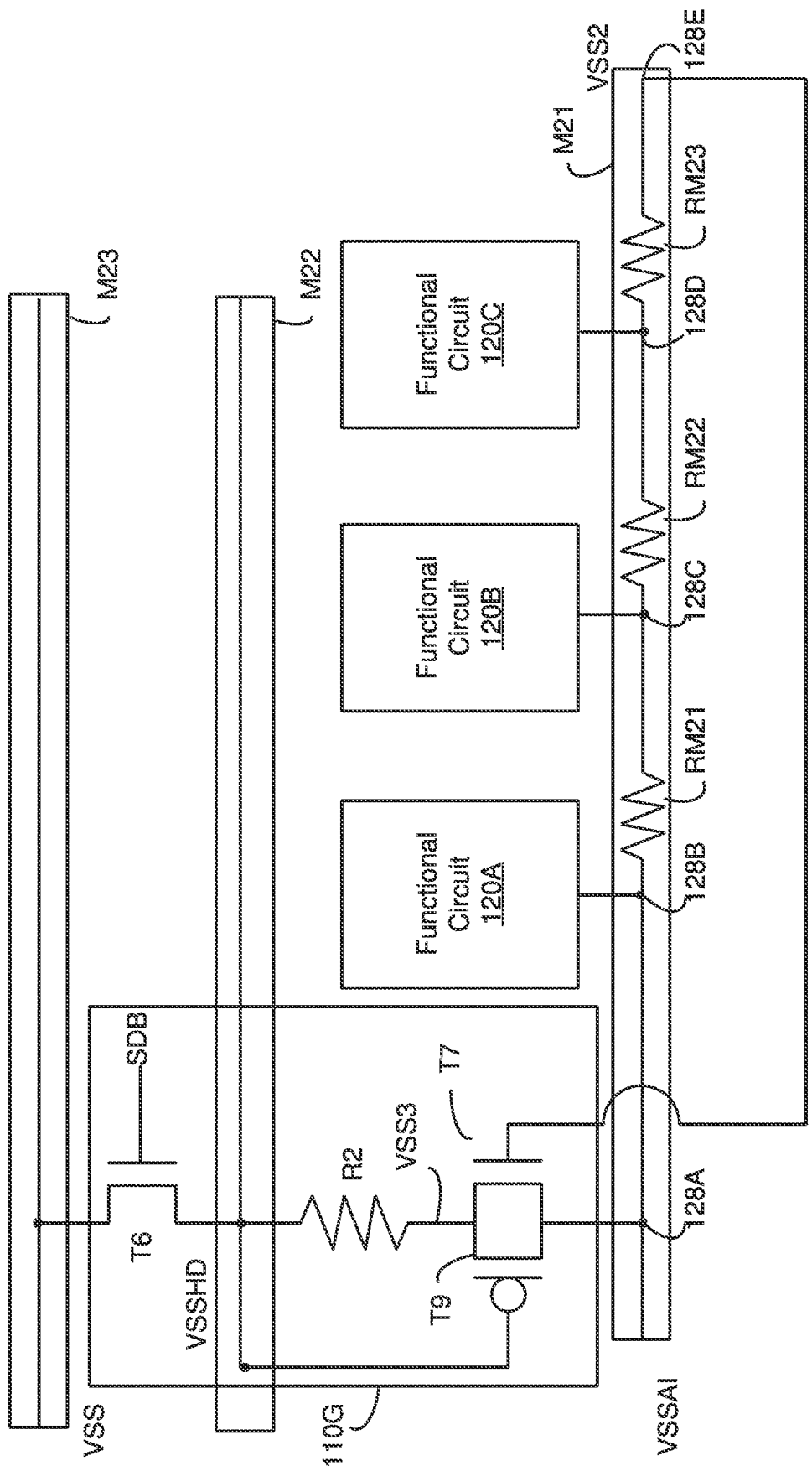
FIG. 8 is a diagram of a voltage regulator, in accordance with one embodiment.

FIG. 8 is a diagram of a portion of the system 100 including a voltage regulator 110G, in accordance with one embodiment. The configuration of the voltage regulator 110G is substantially similar to the voltage regulator 110F of FIG. 7, except the transistor T9 is implemented to replace the transistor T8 of FIG. 7. In some embodiments, the transistor T9 is a P-type transistor. In one configuration, the transistor T9 includes a drain electrode coupled to the metal rail M22, a source electrode coupled to the point 128A of the metal rail M21, and a gate electrode coupled to the metal rail M22. The source electrode of the transistor T9 may be directly coupled to the point 128A of the metal rail M21 and the drain electrode of the transistor T7 though a conductive trace or conductive line. The drain electrode of the transistor T9 may be directly coupled to the source electrode of the transistor T7 though a conductive trace or conductive line. Moreover, the gate electrode of the transistor T9 may be directly coupled to the metal rail M22 (or a drain electrode of the transistor T6) though a conductive trace or conductive line. In this configuration, the supply voltages VSS3, VSSAI, VSS2 can be regulated, despite of parasitic resistances RM21, RM22, RM23, R2. For example, the transistor T9 can adjust or regulate the voltages at the points 128A-128E of the metal rail M21 according to the voltage VSSHD of the metal rail M22 instead of the voltage VSS of the metal rail M23. Hence, the voltage regulator 110G may reduce variations or changes in the voltages at the points 128A-128E of the metal rail M21 to ensure stable operations of the functional circuits 120A, 120B, 120C. In other embodiments, the voltage regulator 110G includes a different component or a different circuit that performs the functionality of the transistor T9.

Figure 9:
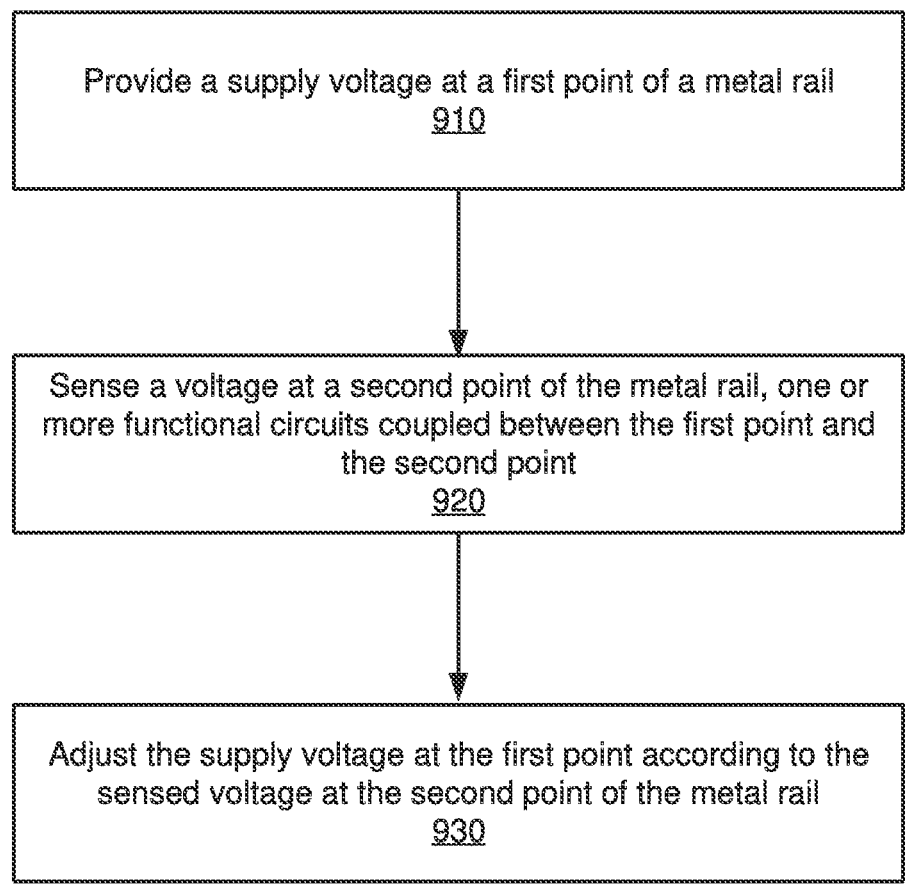
FIG. 9 is a flowchart of a method of regulating a supply voltage at one point of a power rail according to a voltage at another point of the power rail, in accordance with some embodiments.

FIG. 9 is a flowchart of a method 900 of regulating a supply voltage at one point of a power rail according to a voltage at another point of the power rail, in accordance with some embodiments. The method 900 may be performed by any of the voltage regulators 110A and 110D through 110G. In some embodiments, the method 900 is performed by other entities. In some embodiments, the method 900 includes more, fewer, or different operations than shown in FIG. 9.

In an operation 910, a voltage regulator (e.g., 110A and 110D-110G) provides a supply voltage (e.g., VDDAI, VSSAI) at a first point (e.g., 125B, 128B) of a metal rail (e.g., M11, M21). In one configuration, one or more functional circuits are coupled between the first point (e.g., 125B, 128B) and a second point (e.g., 125D, 128D) of the metal rail (e.g., M11, M21). A first functional circuit 120A may be connected to the first point (e.g., 125B, 128B) of the metal rail, and a second functional circuit 120C may be connected to the second point (e.g., 125D, 128D) of the metal rail. When one or more functional circuits (e.g., 120A-120C) are active, voltages at different points of the metal rail between the first point and the second point may change or vary, for example, due to parasitic resistances of the metal rail.

In an operation 920, the voltage regulator (e.g., 110A and 110D-110G) senses a voltage (e.g., VDD2, VSS2) at the second point (e.g., 125D, 128D) of the metal rail (e.g., M11, M21). In an operation 930, the voltage regulator (e.g., 110A and 110D-110G) changes, controls, modifies, or regulates the voltage (e.g., VDDAI, VSSAI) at the first point (e.g., 125B, 128B) of the metal rail (e.g., M11, M21) according to the sensed voltage (e.g., VDD2, VSS2) at the second point (e.g., 125D, 128D) of the metal rail (e.g., M11, M21). In one example, the voltage regulator (e.g., 110A and 110D-110G) includes a transistor (e.g., T3, T7) having a drain electrode coupled to the first point (e.g., 125B, 128B) of the metal rail (e.g., M11, M21) and a gate electrode coupled to the second point (e.g., 125D, 128D) of the metal rail (e.g., M11, M21). For example, if the voltage (e.g., VDD2, VSS2) at the second point (e.g., 125D, 128D) of the metal rail (e.g., M11, M21) decreases, the transistor (e.g., T3, T7) may increase the voltage (e.g., VDDAI, VSSAI) at the first point (e.g., 125B, 128B) of the metal rail (e.g., M11, M21). For example, if the voltage (e.g., VDD2, VSS2) at the second point (e.g., 125D, 128D) of the metal rail (e.g., M11, M21) increases, the transistor (e.g., T3, T7) may decrease the voltage (e.g., VDDAI, VSSAI) at the first point (e.g., 125B, 128B) of the metal rail (e.g., M11, M21). Through negative feedback, the voltage regulator (e.g., 110A and 110D-110G) can reduce variations or changes in the voltage at the metal rail to ensure stable operations of one or more functional circuits coupled to the metal rail.

FIG. 10 is a flowchart of a method 1000 of regulating a first supply voltage (e.g., VDDAI, VSSAI) at a first metal rail (e.g., M11, M21) according to a second supply voltage (e.g., VDD, VDDHD, VSS, VSSHD) at a second metal rail (e.g., M12, M13, M22, M23), in accordance with some embodiments. The method 1000 may be performed by any of the voltage regulators 110B through 110G. In some embodiments, the method 1000 is performed by other entities. In some embodiments, the method 1000 includes more, fewer, or different operations than shown in FIG. 10.

In an operation 1010, the voltage regulator (e.g., 110B-110G) detects, by a transistor (e.g., T4, T5, T8, T9), a change in a first voltage (e.g., VDDAI, VSSAI) at a first metal rail (e.g., M11, M21). The first metal rail (e.g., M11, M21) may be coupled to one or more functional circuits (e.g., 120A-120C). The transistor (e.g., T4, T5, T8, T9) may include a source electrode coupled to the first metal rail (e.g., M11, M21), a gate electrode coupled to a second metal rail (e.g., M12, M13, M22, M23) having a second voltage (e.g., VDD, VDDHD, VSS, VSSHD), and a drain electrode directly or indirectly coupled to the second metal rail (e.g., M12, M13, M22, M23).

In an operation 1020, the voltage regulator (e.g., 110B-110G) adjusts a drive strength (or a transconductance) of the transistor (e.g., T4, T5, T8, T9), according to a change in a difference between the first voltage (e.g., VDDAI, VSSAI) at the first metal rail (e.g., M11, M21) and the second voltage (e.g., VDD, VDDHD, VSS, VSSHD) at the second metal rail (e.g., M12, M13, M22, M23). In an operation 1030, the voltage regulator (e.g., 110B-110G) adjusts the first voltage (e.g., VDDAI, VSSAI) at the first metal rail (e.g., M11, M21) according to the adjusted drive strength of the transistor (e.g., T4, T5, T8, T9). For example, in response to the first voltage (e.g., VDDAI, VSSAI) at the first metal rail (e.g., M11, M21) decreasing, a difference between the second voltage (e.g., VDD, VDDHD, VSS, VSSHD) at the second metal rail (e.g., M12, M13, M22, M23) and the first voltage (e.g., VDDAI, VSSAI) at the first metal rail (e.g., M11, M21) may increase. In response to the difference between the second voltage (e.g., VDD, VDDHD, VSS, VSSHD) at the second metal rail (e.g., M12, M13, M22, M23) and the first voltage (e.g., VDDAI, VSSAI) at the first metal rail (e.g., M11, M21) increasing, the transistor (e.g., T4, T5, T8, T9) may increase its drive strength (or a transconductance) and allow more current to flow through the transistor (e.g., T4, T5, T8, T9) such that the first voltage (e.g., VDDAI, VSSAI) at the first metal rail (e.g., M11, M21) can increase. For example, in response to the first voltage (e.g., VDDAI, VSSAI) at the first metal rail (e.g., M11, M21) increasing, a difference between the second voltage (e.g., VDD, VDDHD, VSS, VSSHD) at the second metal rail (e.g., M12, M13, M22, M23) and the first voltage (e.g., VDDAI, VSSAI) at the first metal rail (e.g., M11, M21) may decrease. In response to the difference between the second voltage (e.g., VDD, VDDHD, VSS, VSSHD) at the second metal rail (e.g., M12, M13, M22, M23) and the first voltage (e.g., VDDAI, VSSAI) at the first metal rail (e.g., M11, M21) decreasing, the transistor (e.g., T4, T5, T8, T9) may decrease its drive strength and allow less current to flow through the transistor (e.g., T4, T5, T8, T9) such that the first voltage (e.g., VDDAI, VSSAI) at the first metal rail (e.g., M11, M21) can decrease. In one aspect, according to a bypass connection at the gate electrode of the transistor (e.g., T4, T5, T8, T9) coupled to the second metal rail (e.g., M12, M13, M22, M23), the voltage regulator (e.g., 110B-110G) can reduce variations or changes in the voltage (e.g., VDDAI, VSSAI) at the first metal rail (e.g., M11, M21) to ensure stable operations of one or more functional circuits (e.g., 120A-120C) coupled to the first metal rail (e.g., M11, M21).

Figure 11:
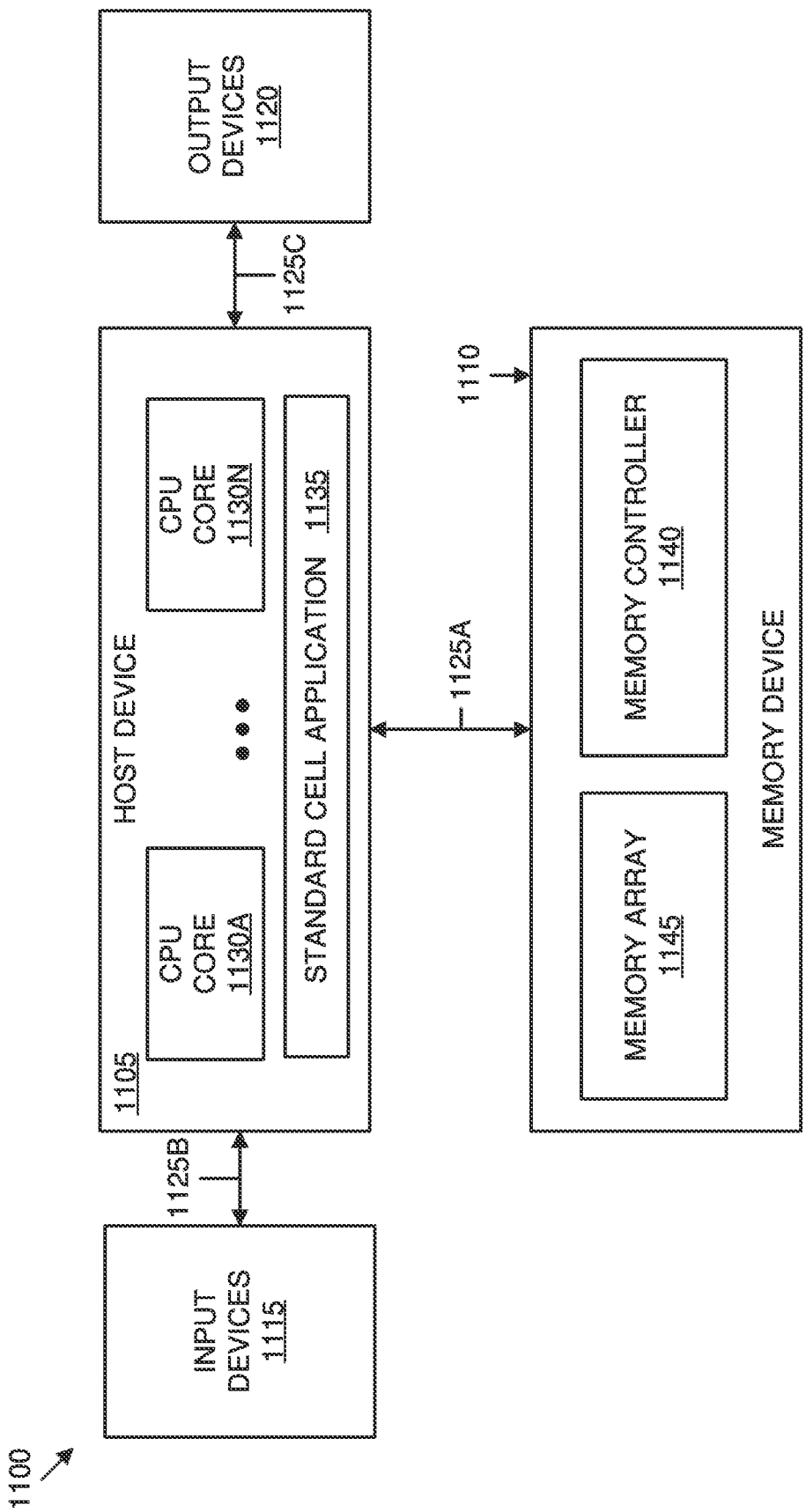
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of a system 100 or a portion of the system 100. After the layout design of the integrated circuit is complete, multiples of the integrated circuit, for example, including the system 100 or a portion of the system 100 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to an integrated circuit. In some embodiments the integrated circuit includes a metal rail including a first point, at which a first functional circuit is connected, and a second point, at which a second functional circuit is connected. In some embodiments, the integrate circuit includes a voltage regulator coupled to the first point of the metal rail and the second point of the metal rail. In some embodiments, the voltage regulator senses a voltage at the second point of the metal rail, and adjusts a supply voltage at the first point of the metal rail, according to the sensed voltage at the second point of the metal rail.

One aspect of this description relates to an integrated circuit. In some embodiments, the integrated circuit includes a first transistor coupled between a first metal rail and a second metal rail and a second transistor coupled between the second metal rail and a third metal rail. In some embodiments, the third metal rail is coupled to one or more functional circuits. In some embodiments, the second transistor senses a change in a difference between a first voltage at a source electrode of the second transistor coupled to the third metal rail and a second voltage at a gate electrode of the second transistor coupled to the first metal rail or the second metal rail, due to the one or more functional circuits. In some embodiments, the second transistor adjusts a third voltage at a drain electrode of the second transistor according to the sensed change in the difference.

One aspect of this description relates to a method of regulating a supply voltage at a metal rail. In some embodiments, the method includes providing, through a drain electrode of a transistor coupled to a first point of the metal rail, a supply voltage. In some embodiments, the method includes sensing, through a gate electrode of the transistor a voltage at a second point of the metal rail. The drain electrode of the transistor may be coupled to the first point of the metal rail and a first functional circuit. In addition, the gate electrode of the transistor may be coupled to the second point of the metal rail and a second functional circuit. In some embodiments, the method includes adjusting the supply voltage at the first point of the metal rail, according to the sensed voltage at the second point of the metal rail. The first functional circuit may be powered by the supply voltage at the first point of the metal rail, and the second functional circuit may be powered by the voltage at the second point of the metal rail The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first metal rail having a first supply voltage and a second metal rail having a second supply voltage; and
a first transistor coupled between the second metal rail and a third metal rail having a third supply voltage, the third metal rail coupled to one or more functional circuits,
wherein the first transistor is configured to regulate the third supply voltage based on the second supply voltage and the third supply voltage.

2. The integrated circuit of claim 1, wherein at least one of the one or more functional circuits includes an active circuit.

3. The integrated circuit of claim 1, wherein the first transistor comprises:
a drain electrode coupled to a resistor coupled to the second metal rail; and
a gate electrode coupled to a first point of the second metal rail.

4. The integrated circuit of claim 3, wherein the first transistor is configured to:
sense the second supply voltage at the first point through the gate electrode; and
adjust the third supply voltage according to the second supply voltage sensed at the first point.

5. The integrated circuit of claim 4, further comprising a second transistor including a drain electrode coupled to the second metal rail, the second transistor to enable or disable current through the first transistor according to a control signal.

6. The integrated circuit of claim 5, wherein the second transistor includes a source electrode coupled to the first metal rail.

7. The integrated circuit of claim 5, wherein the first supply voltage is greater than the second supply voltage.

8. The integrated circuit of claim 1, wherein the first transistor is a P-type transistor.

9. The integrated circuit of claim 1, wherein the one or more functional circuits include a plurality of functional circuits, and where the third metal rail comprises a resistor between the plurality of functional circuits.

10. The integrated circuit of claim 1, further comprising a second transistor coupled to the first transistor in parallel, the first transistor of a first type, and the second transistor of a second type.

11. The integrated circuit of claim 10, wherein the second transistor includes:
a source electrode coupled to the drain electrode of the first transistor, and
a drain electrode coupled to the source electrode of the first transistor.

12. The integrated circuit of claim 11, wherein the second transistor includes a gate electrode coupled to the third metal rail.

13. The integrated circuit of claim 12, wherein the first transistor includes a gate electrode coupled to the first metal rail or the second metal rail.

14. An integrated circuit, comprising:
a switch coupled between a first metal rail and a second metal rail, wherein a first supply voltage is present on the first metal rail and a second supply voltage is present on the second metal rail;
a third metal rail coupled to one or more functional circuits, wherein a third supply voltage is present on the third metal rail; and
a voltage regulator configured to regulate the third supply voltage based on i) the first supply voltage or the second supply voltage, and ii) the third supply voltage.

15. The integrated circuit of claim 14, wherein the voltage regulator comprises a first transistor including:
a gate electrode coupled to the first metal rail;
a source electrode coupled to the third metal rail; and
a drain electrode coupled to the second metal rail.

16. The integrated circuit of claim 15, wherein the voltage regulator comprises a second transistor coupled in parallel with the first transistor between the second metal rail and the third metal rail.

17. The integrated circuit of claim 16, wherein the first transistor is a first type of transistor, and the second transistor is a second type of transistor.

18. The integrated circuit of claim 16, wherein the one or more functional circuits are coupled between a first point of the third metal rail and a second point of the third metal rail, and
   wherein the second transistor includes:
      a gate electrode coupled to the second point of the third metal rail;
      a drain electrode coupled to the first point of the third metal rail; and
      a source electrode coupled to the second metal rail.

19. A method, comprising:
   detecting, using a transistor, a voltage difference between a first supply voltage at a first metal rail and a second supply voltage at a second metal rail; and
   regulating the first supply voltage using a voltage regulator according to the voltage difference.

20. The method of claim 19, further comprising:
   receiving, at a drain electrode of the transistor coupled to the second metal rail, the second supply voltage; and
   providing, at a source electrode of the transistor coupled to the first metal rail, the first supply voltage.

\* \* \* \* \*